(12) United States Patent
Simon

(10) Patent No.: US 7,730,834 B2
(45) Date of Patent: *Jun. 8, 2010

(54) PRINTING APPARATUS AND DEVICE MANUFACTURING METHOD

(75) Inventor: Klaus Simon, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1333 days.

This patent is subject to a terminal disclaimer.

(21) Appl. No.: 10/792,267

(22) Filed: Mar. 4, 2004

(65) Prior Publication Data

US 2005/0193944 A1  Sep. 8, 2005

(51) Int. Cl.
*B41F 31/00* (2006.01)

(52) U.S. Cl. .................. 101/327; 101/109; 101/368

(58) Field of Classification Search .......... 101/327, 101/333, 405, 406, 109, 368; 977/887
See application file for complete search history.

(56) References Cited

U.S. PATENT DOCUMENTS

| | | | |
|---|---|---|---|
| 2,905,085 A * | 9/1959 | Mercer et al. ............ 101/219 |
| 3,298,304 A * | 1/1967 | Carlsen ................. 101/125 |
| 3,361,548 A * | 1/1968 | Hamilton et. al. .......... 65/17.6 |
| 3,362,804 A * | 1/1968 | Hamilton ................. 430/27 |
| 5,512,131 A | 4/1996 | Kumar et al. ........... 156/655.1 |
| 5,772,905 A | 6/1998 | Chou .................... 216/44 |
| 6,165,911 A | 12/2000 | Calveley ................. 438/754 |
| 6,309,580 B1 | 10/2001 | Chou .................... 264/338 |
| 6,334,960 B1 | 1/2002 | Willson et al. ............. 216/52 |
| 6,365,059 B1 | 4/2002 | Pechenik ................. 216/52 |
| 6,375,870 B1 | 4/2002 | Visovsky et al. ........... 264/1.31 |
| 6,482,742 B1 | 11/2002 | Chou .................... 438/690 |
| 6,518,189 B1 | 2/2003 | Chou .................... 438/706 |
| 6,656,341 B2 | 12/2003 | Petersson et al. ........... 205/667 |
| 6,696,220 B2 | 2/2004 | Bailey et al. ............. 430/272.1 |
| 6,719,915 B2 | 4/2004 | Willson et al. ............. 216/44 |
| 6,921,615 B2 | 7/2005 | Sreenivasan et al. .......... 430/22 |
| 7,070,406 B2 * | 7/2006 | Jeans ................... 425/174.4 |
| 2002/0093122 A1 | 7/2002 | Choi et al. ............... 264/401 |
| 2002/0094496 A1 | 7/2002 | Choi et al. ............... 430/322 |
| 2002/0132482 A1 | 9/2002 | Chou .................... 438/692 |
| 2002/0167117 A1 | 11/2002 | Chou .................... 264/338 |

(Continued)

FOREIGN PATENT DOCUMENTS

JP  5-080530 A  4/1993

(Continued)

OTHER PUBLICATIONS

Stephen Y. Chou, et al., "Nanoimprint Lithography", J. Vac. Sci. Technol: B 14(6), Nov./Dec. 1996, pp. 4129-4133.

*Primary Examiner*—Ren Yan
(74) *Attorney, Agent, or Firm*—Pillsbury Winthrop Shaw Pittman LLP

(57) ABSTRACT

The printing apparatus, presented herein, comprises a patterning device having a curved member that supports a stamp on its surface. The curved member is adapted to roll over a substrate to be printed on to transfer the pattern onto the substrate. An illumination system directs light onto the region of the substrate that is being printed in order to set a layer of resist, which has been sprayed onto the substrate. The light is directed via a pattern that is made on the surface of the stamp, thereby transferring the pattern to the substrate.

18 Claims, 1 Drawing Sheet

U.S. PATENT DOCUMENTS

| | | | |
|---|---|---|---|
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |

FOREIGN PATENT DOCUMENTS

| | | |
|---|---|---|
| JP | 7-005693 A | 1/1995 |
| JP | 9-243817 A | 9/1997 |
| JP | 2000-039702 A | 2/2000 |
| JP | 2000289317 A * | 10/2000 |
| JP | 2001-198979 A | 7/2001 |
| JP | 2004-071831 A | 3/2004 |
| JP | 2005-012040 A | 1/2005 |
| WO | WO 9928132 A1 * | 6/1999 |
| WO | WO 01/79591 A1 | 10/2001 |
| WO | WO 01/79592 A1 | 10/2001 |

* cited by examiner

Substrate travel direction

PRINTING APPARATUS AND DEVICE MANUFACTURING METHOD

BACKGROUND OF THE INVENTION

1. Field of the Invention

The present invention relates to a printing apparatus and a device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A known method of imparting a pattern onto a substrate includes applying a stamp vertically onto a substrate covered in resist, illuminating the stamp to set exposed resist or light sensitive material and vertically lifting the stamp off the substrate. Lithographic techniques are often used for such nanometer scale printing on substrates for flat panel displays and the like.

SUMMARY OF THE INVENTION

The principles of the present invention, as embodied and broadly described herein, provide a patterning device that is less expensive to create and use than known methods. In one embodiment, a printing apparatus for nanometric scale imprinting is provided comprising a curved member for supporting a stamp, the curved member being adapted to roll over a substrate to be printed on, and the stamp having a pattern in its surface, and an illumination system for directing light to a region of contact between said stamp and said substrate.

An advantage of rolling the curved member over the substrate, rather than vertically applying a stamp is that while the curved member rotates, is that the distance between the stamp and the substrate is maintained. Because it is a rolling process rather than a vertical stamping process, the throughput of substrates can be higher since the stamp does not have to stop at any time—in other words, it can continue to roll at a steady rate as long as the stamp patterns on the surface of the curved member are placed with a separation consistent with the separation of substrates coming into the process device. Furthermore, a vertically applied stamp is limited in its speed of application because of the risk of damaging substrates. The rolling of the curved member eliminates the risk of damage caused by impact and removal of a vertically applied stamp.

Moreover, the curved member need not be rolled continuously, as it could be swung back and forth over the substrate, giving the effect of being rolled over the substrate, but in two directions rather than just the one.

The curved member may have a triangular cross section with curved sides, for example, the curved member may be the shape of a Wankel motor. The advantage of this shape over a standard cylinder is that the size of the curved member can be reduced while the radius of curvature of the stamp is kept large enough to cover the target portion of the substrate.

The illumination system may be located inside the curved member. This affords the advantage of keeping the illumination means in a central location in the curved member so that no matter which side of the member is facing the substrate, the illumination means is illuminating the substrate via the stamp on the surface of the curved member. Alternatively, the illumination means could be on the outside of the curved member with means to illuminate the target area.

There are preferably thermal elements for controlling the temperature of the curved member to align the stamp with the target portion of the substrate and for correcting the magnification of the pattern on the stamp. Magnification of the pattern may be adjusted by stretching the stamp or the substrate. The pattern is set onto the substrate with the correct alignment and at the correct magnification, otherwise the substrate will not be able to serve its purpose. The border of the stamp and/or the substrate can be constantly monitored and the thermal elements may be used either in the substrate or the stamp to adjust the relative positions and magnifications, even "on the fly".

The stamp may be made of glass and comprise a patterned layer on its surface. The advantage of using glass is that it allows the illumination in this case to pass through the unpatterned sections of the glass. The stamp may alternatively be made of quartz glass or any material that allows the illumination radiation to be transmitted to the resist while being formable into the curved member shape.

There is preferably provided a resist provider for providing a layer of resist on the target portion of the substrate and the resist is preferably a liquid that sets when illuminated. The resist may be sprayed onto the substrate before the introduction of the stamp. There may also be a release agent sprayed onto the surface of the stamp.

There are usefully alignment markers along the stamp for aligning with markers along the substrate. This allows the rolling curved member and the stamp on its surface to maintain its alignment with the substrate so that the pattern is imparted to the target portion of the substrate.

According to a further aspect of the invention, there is provided a device manufacturing method comprising providing a substrate, providing a layer of resist on a target portion of the substrate, providing a beam of radiation using an illumination system, providing a curved member with a pattern on its surface, rolling the curved member over the substrate, and projecting the beam of radiation onto the resist.

Although specific reference may be made in this text to the manufacture of flat panel displays, it should be understood that the printing apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the term "wafer" herein may be considered as synonymous with the more general term "substrate".

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Embodiments

Figure 1:
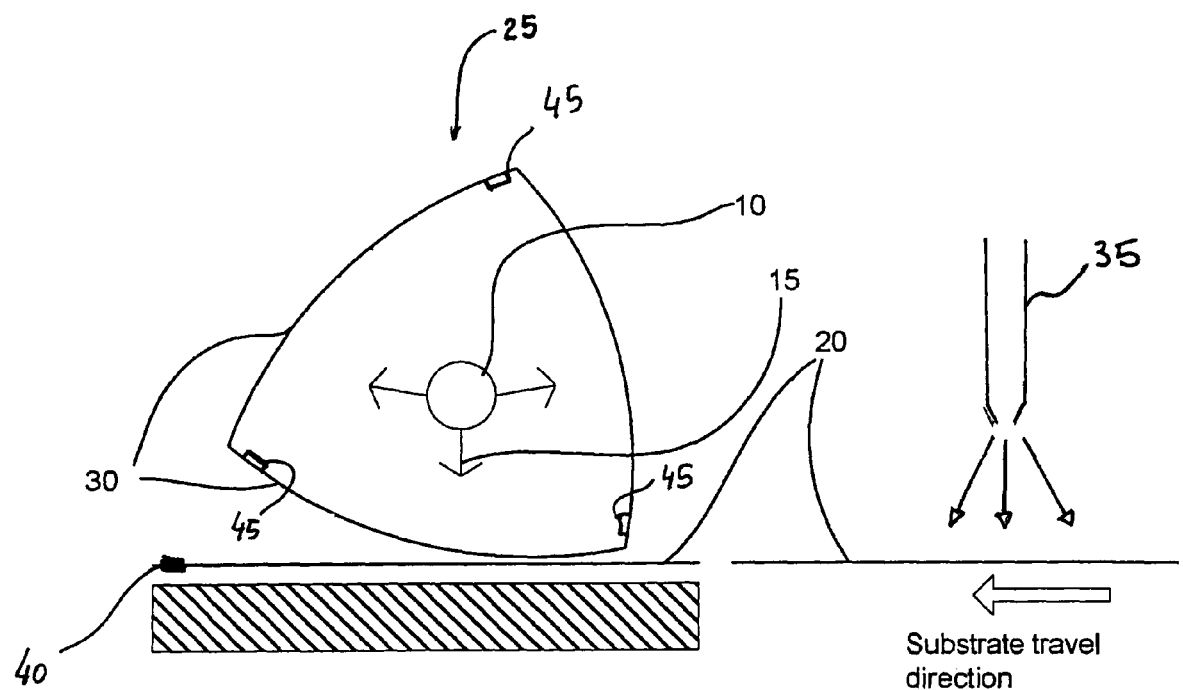
FIG. 1 depicts a printing apparatus in accordance with the present invention.

FIG. 1 depicts substrates 20 being introduced into the patterning device. The curved member 25 includes a patterning stamp 30 on its surfaces, which contains a desired pattern. The curved member 25 is rolled over the substrates 20. Each patterning stamp 30 on the surfaces of the curved member 25 are configured to be the correct size to print the desired pattern onto a single substrate 20. As the patterning stamp 30 rolls over a substrate 20, the illumination means 10 illuminates the substrate via the patterned surface 30.

Exposure radiation 15 is the illumination radiating in the correct direction in order to set the resist via the stamp pattern. The resist on the substrate 20 sets where the pattern allows the exposure radiation 15 to be transmitted through the curved member 25 wall. The system, in some ways, is analogous to a newspaper printing system except that instead of a round cylinder, a Wankel motor-shaped cylinder is used. In this manner, the surfaces of the curved member 25 are able to have a radius of curvature grater than the radius of the cylinder.

The patterning stamp 30 is made of patterned glass or quartz glass. The pattern might be etched into the glass or bonded to it and might be covered with non-adhesive/non-sticking layers. The glass may be patterned and then bent into the cylinder shape or vice versa. The illumination means 10 emits radiation suitable for setting the resist, which is sprayed onto the substrates 20 before they enter the device. The contact between the curved member 25 and the substrate 20 is "soft"; i.e. there is a gap of several nm.

The resist that is sprayed with a resist provider 35 onto the substrate 20 is a liquid until it is exposed to the exposure radiation 15, at which point it sets to a solid, any unset resist being removable by a release agent.

The substrate 20 is a glass panel in the case of the manufacture of flat panel displays, though it may also be plastic or silicon. The substrate 20 is preferably the same size as the stamp in order to enable the more efficient alignment of the stamps and substrates.

There are preferably thermal elements 40 for controlling the temperature of the curved member 25 to align the patterning stamp 30 with the target portion of the substrate and for correcting the magnification of the pattern on the stamp 30. The pattern is set onto the substrate 30 with the correct alignment and at the correct magnification, otherwise the substrate 20 will not be able to serve its purpose. The border of the stamp 30 and/or the substrate 20 can be constantly monitored and the thermal elements 40 may be used either in the substrate 20 or the stamp 30 to adjust the relative positions and magnifications, even "on the fly."

In order to ensure that the pattern is correctly imprinted onto the target portion of the substrate 20, alignment markers 45 are printed along the edges of the stamp 30, which are aligned with markers in scribe lanes along the edge of the substrate 20.

Magnification of the pattern may be adjusted by stretching the stamp 30 or the substrate 20. In order to control the magnification of the pattern, the stamp 30 or the substrate 20 can be stretched in the range of a few parts per million.

Whilst specific embodiments of the invention have been described above, it will be appreciated that the invention may be practiced otherwise than as described. As such, the description is not intended to limit the invention.

The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A printing apparatus, comprising:
a curved member carrying a stamp surface having a plurality of separate curved sides that form a periphery of the curved member, each of said curved sides defining a convex surface that intersects with two other of said curved sides, and each of said curved sides including a pattern, wherein, in use, said curved member is configured to roll over a substrate to transfer said pattern on said substrate such that, as said curved member rolls over said substrate, said pattern of each of said curved sides remains stationary relative to each of said curved sides; and
an illumination system configured to direct light to a region of contact between said stamp surface and said substrate.

2. The apparatus of claim 1, wherein said curved member has a triangular cross section with curved sides.

3. The apparatus of claim 1, wherein said illumination system is located inside said curved member.

4. The apparatus of claim 1, further comprising thermal elements configured to control temperature of said curved member, to align said stamp surface, and to correct magnification of said stamp surface.

5. The apparatus of claim 1, wherein said stamp surface is comprised of glass.

6. The apparatus of claim 1, further comprising a resist mechanism configured to provide a layer of resist on a target portion of said substrate.

7. The apparatus of claim 6, wherein said resist sets when illuminated.

8. The apparatus of claim 1, further comprising alignment markers along said stamp surface configured to align with markers along said substrate.

9. The apparatus of claim 1, wherein the plurality of separate curved sides have a same curvature.

10. The apparatus of claim 1, wherein the curved member has a shape of a Wankel motor-shaped cylinder.

11. A printing apparatus for nanometric scale imprinting, comprising:
a curved member carrying a stamp surface having a plurality of separate curved sides that form a periphery of the curved member, each of said curved sides defining a convex surface that intersects with two other of said curved sides, and each of said curved sides including a pattern wherein, in use, said curved member is configured to roll over a substrate to transfer said pattern onto said substrate such that, as said curved member rolls over said substrate, said pattern of each of said curved sides remains stationary relative to each of said curved sides;

a resist mechanism configured to provide a layer of resist on said substrate; and an illumination system configured to direct light onto a region where said stamp surface has contacted said layer of resist on said substrate.

12. The apparatus of claim 11, wherein said curved member has a triangular cross section with curved sides.

13. The apparatus of claim 12, further comprising alignment markers along said stamp surface configured to align with markers along said substrate.

14. The apparatus of claim 11, wherein said illumination system is located inside said curved member.

15. The apparatus of claim 11, further comprising thermal elements configured to control temperature of said curved member.

16. The apparatus of claim 11, wherein said stamp surface is comprised of glass.

17. The apparatus of claim 11, wherein the plurality of separate curved sides have a same curvature.

18. The apparatus of claim 11, wherein the curved member has a shape of a Wankel motor-shaped cylinder.

* * * * *